United States Patent
Li

(10) Patent No.: US 11,656,245 B2
(45) Date of Patent: May 23, 2023

(54) METHOD AND DEVICE FOR MEASURING DIMENSION OF SEMICONDUCTOR STRUCTURE

(71) Applicant: CHANGXIN MEMORY TECHNOLOGIES, INC., Hefei (CN)

(72) Inventor: Zheng Li, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 137 days.

(21) Appl. No.: 17/392,430

(22) Filed: Aug. 3, 2021

(65) Prior Publication Data

US 2022/0229087 A1 Jul. 21, 2022

Related U.S. Application Data

(63) Continuation of application No. PCT/CN2021/098842, filed on Jun. 8, 2021.

(30) Foreign Application Priority Data

Jan. 15, 2021 (CN) .......................... 202110053191.8

(51) Int. Cl.
  *G01Q 60/24* (2010.01)
  *G01Q 20/00* (2010.01)
  *G01Q 10/02* (2010.01)

(52) U.S. Cl.
  CPC .............. *G01Q 60/24* (2013.01); *G01Q 10/02* (2013.01); *G01Q 20/00* (2013.01)

(58) Field of Classification Search
  CPC ......... G01Q 60/24; G01Q 10/02; G01Q 20/00
  USPC ................................. 850/1, 2, 3, 4, 5, 6, 7
  See application file for complete search history.

(56) References Cited

U.S. PATENT DOCUMENTS

| | | | |
|---|---|---|---|
| 5,894,122 A | * | 4/1999 | Tomita ................... B82Y 20/00 250/234 |
| 2006/0267622 A1 | * | 11/2006 | Lagowski ............ G01R 31/312 324/754.21 |

FOREIGN PATENT DOCUMENTS

| | | |
|---|---|---|
| CN | 1727871 A | 2/2006 |
| TW | I656347 B | 4/2019 |

* cited by examiner

*Primary Examiner* — Nicole M Ippolito
(74) *Attorney, Agent, or Firm* — Cooper Legal Group, LLC

(57) ABSTRACT

A method and device for measuring dimension of a semiconductor structure are provided. A probe of an Atomic Force Microscope (AFM) is controlled at first to move a first distance from a preset reference position to a top surface of a semiconductor structure to be measured in a direction perpendicular to the top surface of the semiconductor structure to be measured, then the probe is controlled to scan the surface of the semiconductor structure to be measured while keeping the first distance in a direction parallel to the top surface of the semiconductor structure to be measured, amplitudes of the probe at respective scanning points on the surface of the semiconductor structure to be measured are detected, and a Critical Dimension (CD) of the semiconductor structure to be measured is determined according to the amplitudes of the probe at respective scanning points on the surface of the semiconductor structure.

20 Claims, 5 Drawing Sheets

METHOD AND DEVICE FOR MEASURING DIMENSION OF SEMICONDUCTOR STRUCTURE

CROSS-REFERENCE TO RELATED APPLICATION

The present application is a continuation of International Patent Application No. PCT/CN2021/098842, which is based on and claims priority to Chinese Patent Application No. 202110053191.8, filed to the China National Intellectual Property Administration on Jan. 15, 2021 and entitled "METHOD AND DEVICE FOR MEASURING DIMENSION OF A SEMICONDUCTOR STRUCTURE". The disclosures of International Patent Application No. PCT/CN2021/098842 and Chinese Patent Application No. 202110053191.8 are hereby incorporated by reference in their entireties.

BACKGROUND

With the increase of integration levels of semiconductor chips, graphic line width dimensions of integrated circuit lines have entered the nanoscale, influences of Critical Dimensions (CDs) formed by machining on the performance of semiconductor chips have increased, and thus measuring a CD of a semiconductor chip accurately has become the key to improving the performance and quality of the semiconductor chip.

Atomic Force Microscope (AFM) is high in measurement accuracy, may implement measurement of a semiconductor structure without damaging the semiconductor structure when a non-contact measurement mode is adopted, and thus is applied to measurement of nanoscale semiconductor structures extensively.

At present, when an AFM measures a surface of a semiconductor structure using a non-contact mode, a probe of the AFM is usually controlled to oscillate at a position 5 nm to 10 nm above the surface of the semiconductor structure, and in such case, an interaction force between the semiconductor structure and the probe may be detected to analytically obtain a surface structure of the semiconductor structure. However, when there is a trench with a small width but a relatively great depth-to-width ratio, i.e., a trench with a relatively high aspect ratio, in the surface of the semiconductor structure, the probe of the AFM needs to reach a certain distance from a surface of the trench, and may easily contact with a sidewall of the trench in a measurement process to damage the semiconductor structure.

SUMMARY

Embodiments of the present disclosure relate to the technical field of semiconductors, and particularly to a method and device for measuring dimension of a semiconductor structure.

According to a first aspect, the embodiments of the present disclosure provide a method for measuring dimension of a semiconductor structure, which include the following operations. A probe of an AFM is controlled to move a first distance from a preset reference position to a top surface of a semiconductor structure to be measured in a direction perpendicular to the top surface of the semiconductor structure to be measured.

The probe is controlled to scan the surface of the semiconductor structure to be measured while keeping the first distance in a direction parallel to the top surface of the semiconductor structure to be measured, and amplitudes of the probe at respective scanning points on the surface of the semiconductor structure to be measured are detected. A CD of the semiconductor structure to be measured is determined according to the amplitudes of the probe at respective scanning points on the surface of the semiconductor structure to be measured.

According to a second aspect, the embodiments of the present disclosure provide An apparatus for measuring dimension of a semiconductor structure, which may include a control module, a detection module, and a processing module. The control module may be configured to control a probe of an AFM to move a first distance from a preset reference position to a top surface of a semiconductor structure to be measured in a direction perpendicular to the top surface of the semiconductor structure to be measured. The detection module may be configured to control the probe to scan the surface of the semiconductor structure to be measured while keeping the first distance in a direction parallel to the top surface of the semiconductor structure to be measured, and detect amplitudes of the probe at respective scanning points on the surface of the semiconductor structure to be measured. The processing module may be configured to determine a CD of the semiconductor structure to be measured according to the amplitudes of the probe at respective scanning points on the surface of the semiconductor structure to be measured.

According to a third aspect, the embodiments of the present disclosure provide an AFM, which may include at least one processor and a memory. The memory may store computer-executable instructions. When the at least one processor executes the computer-executable instructions stored in the memory, the at least one processor may execute the method for measuring dimension of a semiconductor structure provided in the first aspect.

According to a fourth aspect, the embodiments of the present disclosure provide a computer-readable storage medium, in which a computer-executable instruction may be stored, the computer-executable instruction being executed to implement the method for measuring dimension of a semiconductor structure provided in the first aspect.

According to a fifth aspect, the embodiments of the present disclosure provide a computer program product, which may include a computer program, the computer program being executed by a processor to implement the method for measuring dimension of a semiconductor structure provided in the first aspect.

BRIEF DESCRIPTION OF THE DRAWINGS

In order to describe the technical solutions in the embodiments of the present disclosure or the conventional art more clearly, the drawings required to be used in descriptions about the embodiments of the present disclosure or the conventional art will be simply introduced below. It is apparent that the drawings described below are some embodiments of the present disclosure. Other drawings may further be obtained by those of ordinary skill in the art according to these drawings without creative work.

DETAILED DESCRIPTION

Figure 1:
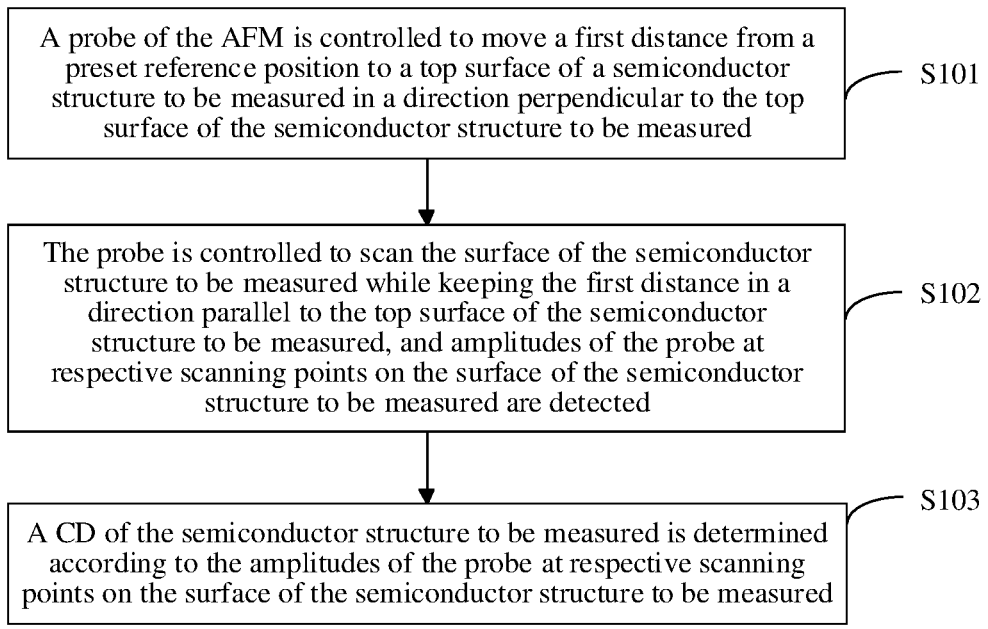
FIG. 1 is a first flowchart of a method for measuring dimension of a semiconductor structure according to an embodiment of the present disclosure.

In order to make the purpose, technical solutions, and advantages of the embodiments of the present disclosure clearer, the technical solutions in the embodiments of the present disclosure will be clearly and completely described below in combination with the drawings in the embodiments of the present disclosure. It is apparent that the described embodiments are not all embodiments but part of embodiments of the present disclosure. All other embodiments obtained by those of ordinary skill in the art on the basis of the embodiments in the present disclosure without creative work shall fall within the scope of protection of the present disclosure.

Terms "first", "second", and the like in the specification, claims, and drawings of the present disclosure are adopted not to describe a specific sequence or order but to distinguish similar objects. It should be understood that data used like this may be interchanged as appropriate such that the embodiments of the present disclosure described here may be implemented, for example, according to sequences in addition to those illustrated or described here.

In addition, terms "include" and "have" and any transformations thereof are intended to cover nonexclusive inclusions. For example, a process, method, system, product, or device including a series of steps or units is not limited to the steps or units that are clearly listed but may include other steps or units that are not clearly listed or intrinsic to the process, the method, the product, or the device.

At present, AFM is high in measurement accuracy, may implement measurement of a semiconductor structure without damaging the semiconductor structure when a non-contact measurement mode is adopted, and thus has been applied to measurement of process dimensions of nanoscale semiconductor structures such as a Dynamic Random Access Memory (DRAM) extensively.

An AFM detects an extremely weak interatomic acting force between a surface of a semiconductor structure to be measured and a micro force sensing element to research a surface structure and property of the semiconductor structure. In a measurement process, one end of a micro cantilever extremely sensitive to a micro force is fixed, and a micro probe at the other end is close to the surface of the semiconductor structure. In such case, the micro probe interacts with the surface of the semiconductor structure, and an acting force deforms the micro cantilever or changes a movement state. When the probe scans the surface of the semiconductor structure, such changes of the probe may be detected using a sensor to obtain distribution information of the acting force, thereby obtaining surface morphologic structure information and surface roughness information of the semiconductor structure.

In an existing measurement process, when an AFM measures a surface of a semiconductor structure using a non-contact mode, a probe of the AFM is usually controlled to oscillate at a position 5 to 10 nm above the surface of the semiconductor structure, and in such case, an interaction force between the semiconductor structure and the probe may be detected to analytically obtain a surface structure of the semiconductor structure. However, when there is a trench with a small width but a relatively great depth-to-width ratio, i.e., a trench with a relatively high aspect ratio, in the surface of the semiconductor structure, the probe of the AFM needs to reach a certain distance from a surface of the trench, and may easily contact with a sidewall of the trench in a measurement process to damage the semiconductor structure. In addition, for a photoresistor with a high-aspect-ratio trench, it is difficult to measure a CD of the high-aspect-ratio trench thereof even using a conventional non-contact measurement mode of the AFM.

The technical problem in the conventional art that, when there is a trench with a small width but a relatively great depth-to-width ratio, i.e., a trench with a relatively high aspect ratio, in a surface of a semiconductor structure, a probe of an AFM needs to reach a certain distance from a surface of the trench and may easily damage the semiconductor structure in a measurement process may be solved. For solving the foregoing technical problem, the embodiments of the present disclosure provide a method for measuring dimension of a semiconductor structure. A spacing distance between a probe of an AFM and a top surface of a semiconductor structure to be measured may not be affected by a surface structure of the semiconductor structure to be measured, so that, when there is a trench with a small width but a relatively great depth-to-width ratio, i.e., a trench with a high aspect ratio, in the surface of the semiconductor structure to be measured, the probe of the AFM may not descend into the trench for scanning and contact with a sidewall of the trench in a measurement process, which avoids damages to the semiconductor structure to be measured. In addition, amplitudes of the probe at respective scanning points on the surface of the semiconductor structure to be measured are detected to determine a CD of the semiconductor structure to be measured, and an interaction force between the semiconductor structure to be measured and the probe is not required to be detected, so that a measurement manner is simple, influences of the surface structure of the semiconductor structure to be measured are eliminated, the method may be used to measure a CD of a photoresistor, and application range is wider.

The technical solution of the present disclosure will be described below in detail with specific embodiments. It can be understood that the following specific embodiments may be combined. The same or similar concepts or processes will not be elaborated in some embodiments.

References are made to FIG. 1. FIG. 1 is a first flowchart of a method for measuring dimension of a semiconductor structure according to an embodiment of the present disclosure. An execution body of the embodiment is an AFM or an external device connected with the AFM, or may be executed by the AFM and the external device connected with the AFM together. As shown in FIG. 1, the method for measuring dimension of a semiconductor structure includes the following operations.

In S101, a probe of the AFM is controlled to move a first distance from a preset reference position to a top surface of a semiconductor structure to be measured in a direction perpendicular to the top surface of the semiconductor structure to be measured.

Figure 2:
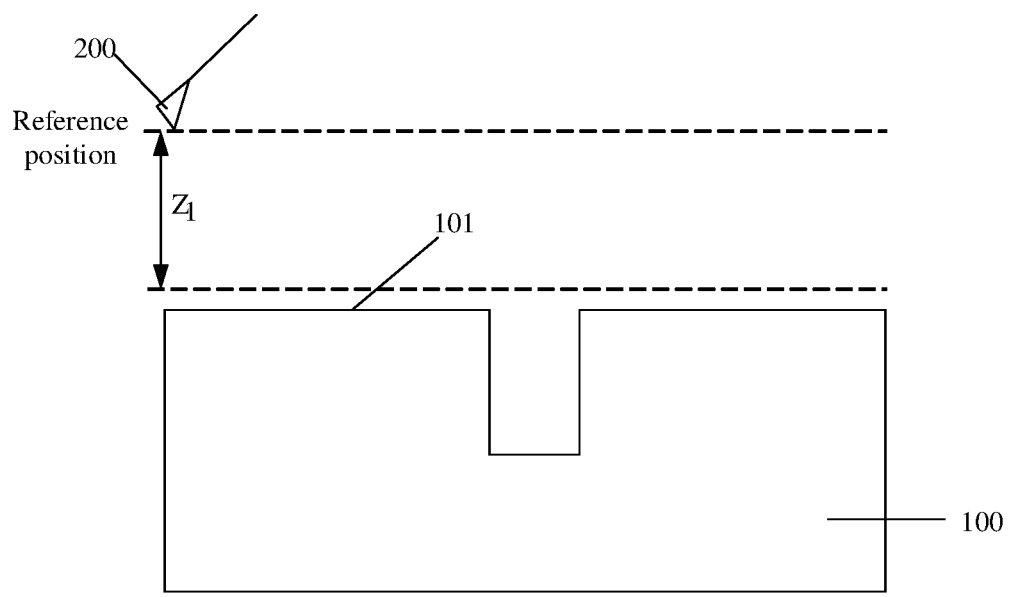
FIG. 2 is a first schematic diagram of a scenario in which the dimension of a semiconductor structure is measured according to an embodiment of the present disclosure.

For understanding the embodiment of the present disclosure better, references are made to FIG. 2. FIG. 2 is a first schematic diagram of a scenario in which the dimension of a semiconductor structure is measured according to an embodiment of the present disclosure.

In FIG. 2, the probe 200 of the AFM may be controlled to move the first distance $Z_1$ from the preset reference position to the top surface 101 of the semiconductor structure 100 to be measured in the direction perpendicular to the top surface 101 of the semiconductor structure 100 to be measured.

A vertical distance between the reference position and the top surface 101 of the semiconductor structure 100 is greater than the first distance $Z_1$.

In S102, the probe is controlled to scan the surface of the semiconductor structure to be measured while keeping the first distance in a direction parallel to the top surface of the semiconductor structure to be measured, and amplitudes of the probe at respective scanning points on the surface of the semiconductor structure to be measured are detected.

Figure 3:
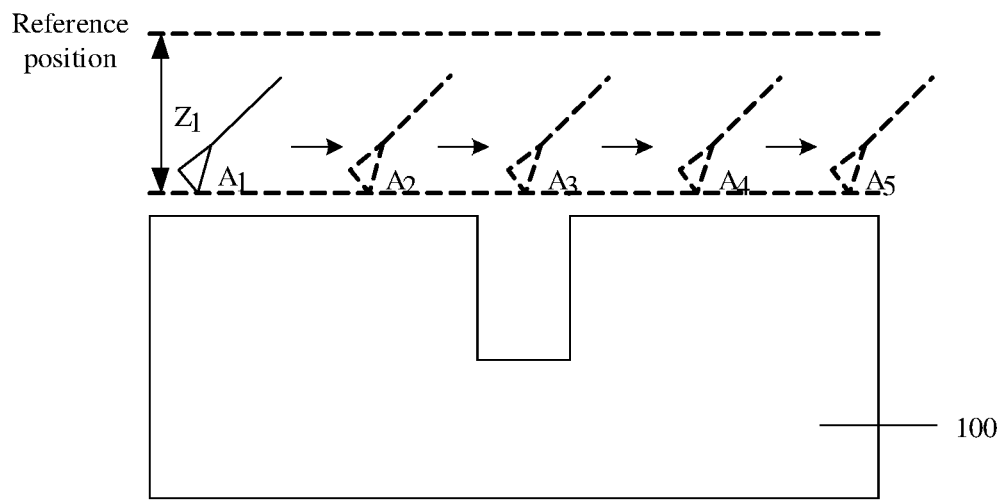
FIG. 3 is a second schematic diagram of a scenario in which the dimension of a semiconductor structure is measured according to an embodiment of the present disclosure.

For understanding the embodiment of the present disclosure better, references are made to FIG. 3. FIG. 3 is a second schematic diagram of a scenario in which the dimension of a semiconductor structure is measured according to an embodiment of the present disclosure.

In FIG. 3, the probe 200 is controlled to scan the surface 101 of the semiconductor structure 100 to be measured keeping the first distance $Z_1$ in the direction parallel to the top surface 101 of the semiconductor structure 100 to be measured. For example, scanning is performed sequentially at scanning point A2, scanning point A3, scanning point A4, scanning point A5, etc., from scanning point A1.

A distance between the probe 200 and the reference position keeps the first distance $Z_1$ in a scanning process. That is, when there is a trench in the top surface 101 of the semiconductor structure 100 to be measured, the probe may not descend into the trench for scanning, and instead, keeps the first distance $Z_1$ from the reference position for scanning.

In the scanning process of the probe 200, a driving frequency of the probe 200 is kept unchanged. That is, the amplitude of the probe 200 is kept unchanged when there is no acting force or an acting force on the probe is kept unchanged.

In the embodiment of the present disclosure, when the probe 200 scans the surface 101 of the semiconductor structure 100 to be measured, the amplitudes of the probe 200 at each scanning point are detected in real time.

In S103, a CD of the semiconductor structure to be measured is determined according to the amplitudes of the probe at respective scanning points on the surface of the semiconductor structure to be measured.

It can be understood that, according to the Lennard-Jones potential principle, if a distance between the probe of the AFM and the top surface of the semiconductor structure to be measured, an interaction force of the surface of the semiconductor structure on the probe may be stronger. When the driving frequency of the probe is kept unchanged, the interaction force on the probe is stronger, and the amplitude of the probe may be lower.

Based on the abovementioned principle, in the embodiment of the present disclosure, a changing condition of the distance between the probe of the AFM and the surface of the semiconductor structure to be measured may be determined according to a changing condition of the amplitudes of the probe at respective scanning points on the surface of the semiconductor structure to be measured, thereby determining the CD of the semiconductor structure to be measured.

In a feasible implementation, the semiconductor structure to be measured is a photoresistor.

It is to be noted that, although an existing Critical Dimension-Scanning Electron Microscope (CD-SEM) may be used to measure a semiconductor structure with a high-aspect-ratio trench, the CD-SEM mainly implements measurement based on electron-beam bombardment over a surface of the semiconductor, and since surface strength of a photoresistor is relatively low, the existing CD-SEM cannot measure a CD of the photoresistor accurately. According to the measurement method provided in the embodiment of the present disclosure, a measurement manner of the AFM is improved, so that the AFM may be applied to CD measurement of a photoresistor with a high-aspect-ratio trench, and is wider in application range.

According to the method for measuring dimension of a semiconductor structure provided in the embodiment of the present disclosure, a spacing distance between the probe of the AFM and the surface of the semiconductor structure to be measured is not affected by a surface structure of the semiconductor structure to be measured, so that, when there is a trench with a small width but a relatively great depth-to-width ratio, i.e., a trench with a high aspect ratio, in the surface of the semiconductor structure to be measured, the probe may not descend into the trench for scanning and contact with a sidewall of the trench in the measurement process, which avoids damages to the semiconductor structure to be measured. In addition, in the present disclosure, the amplitudes of the probe at respective scanning points on the surface of the semiconductor structure to be measured are detected to determine the CD of the semiconductor structure to be measured, and an interaction force between the semiconductor structure to be measured and the probe is not required to be detected, so that a measurement manner is simple, influences of the surface structure of the semiconductor structure to be measured are eliminated, and the present disclosure range is wider.

Figure 4:
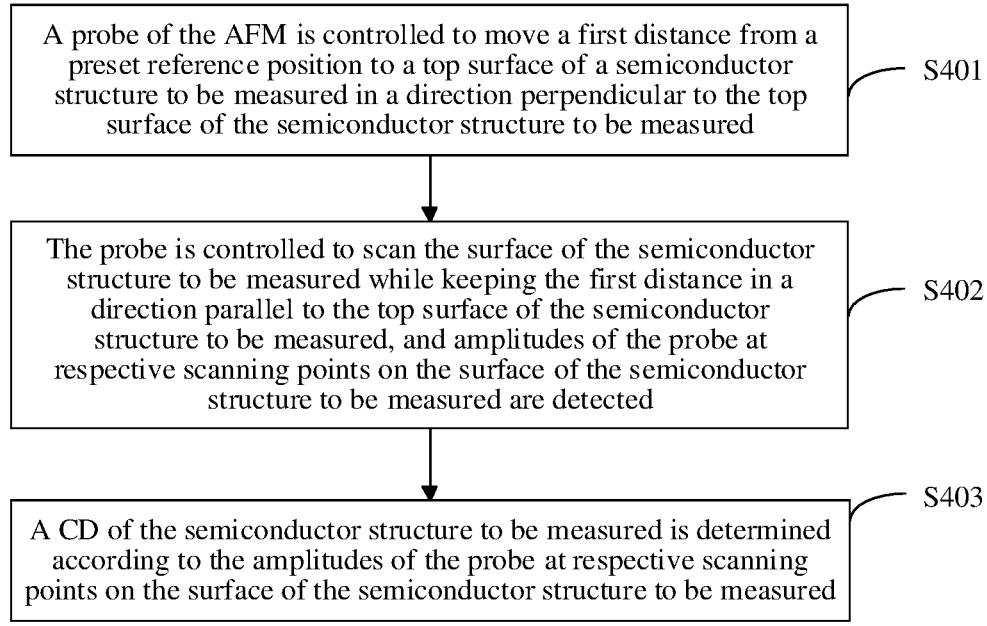
FIG. 4 is a second flowchart of a method for measuring dimension of a semiconductor structure according to an embodiment of the present disclosure.

Based on the contents described in the abovementioned embodiment, in a feasible implementation of the present disclosure, references are made to FIG. 4. FIG. 4 is a second flowchart of a method for measuring dimension of a semiconductor structure according to an embodiment of the present disclosure. The method for measuring dimension of a semiconductor structure further includes the following operations.

In S401, the probe is controlled to move the first distance from the preset reference position to a top surface of a semiconductor reference sample in a direction perpendicular to the top surface of the semiconductor reference sample.

In the embodiment of the present disclosure, the reference position may be preset. When the semiconductor reference sample is fixed on a measurement table of the AFM, and the probe of the AFM is at the reference position, the probe of the AFM may be free of an acting force of the top surface of the semiconductor reference sample.

The semiconductor reference sample can be understood as a semiconductor structure with the same surface structure as the semiconductor structure to be measured.

In a feasible implementation, before measurement, the first distance may be determined at first through the following operations.

In step a, a first amplitude when the probe is at the preset reference position and a driving frequency is a target driving frequency value and a second amplitude when the probe moves the first distance in the direction perpendicular to the top surface of the semiconductor reference sample and the driving frequency is the target driving frequency value are determined according to relation between a curve of an amplitude and driving frequency of the probe in absence of an acting force and a curve of an amplitude and driving frequency of the probe in presence of an acting force.

Figure 5:
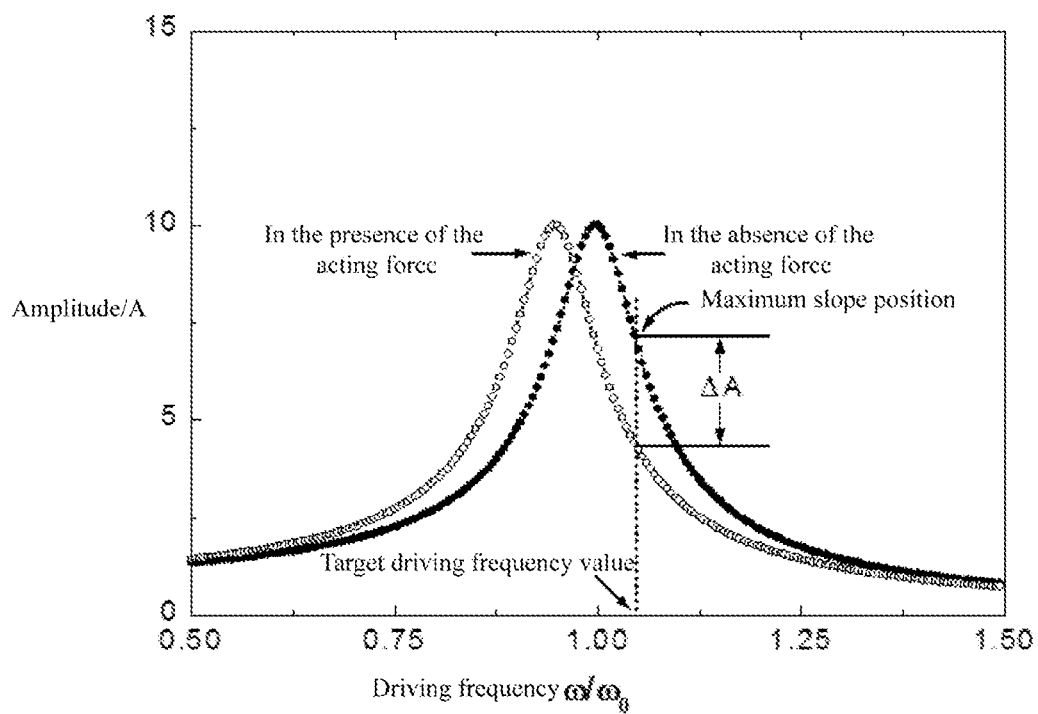
FIG. 5 is a schematic diagram of the relation between a curve of an amplitude and driving frequency of a probe of an AFM in the absence of an acting force and a curve of an amplitude and driving frequency of a probe of an AFM in the presence of an acting force according to an embodiment of the present disclosure.

For understanding the embodiment of the present disclosure better, references are made to FIG. 5. FIG. 5 is a schematic diagram of the relation between a curve of n amplitude and driving frequency of a probe of an AFM in the absence of an acting force and a curve of n amplitude and driving frequency of a probe of an AFM in the presence of an acting force according to an embodiment of the present disclosure.

It can be seen from FIG. 5 that the amplitude of the probe of the AFM may change with the driving frequency in the absence and presence of the acting force. In the embodiment of the present disclosure, a maximum value of a difference $\Delta A$ between amplitudes of the probe of the AFM in the absence and presence of the acting force may be determined, namely a "maximum slope position" shown in FIG. 5 may be determined, according to the diagram of the curvilinear relations between the amplitude and driving frequency of the probe of the AFM in the absence and presence of the acting force.

After the "maximum slope position" shown in FIG. 5 is determined, a driving frequency corresponding to the "maximum slope position" is determined as the target driving frequency value. When the driving frequency is the target driving frequency value, the amplitude of the probe of the AFM in the absence of the acting force is determined as the first amplitude, and the amplitude of the probe of the AFM in the presence of the acting force is determined as the second amplitude.

In step b, the probe is adjusted to the preset reference position, and the driving frequency of the probe is adjusted to the target driving frequency value.

In step c, the probe is controlled to move for multiple times from the preset reference position in the direction perpendicular to the top surface of the semiconductor reference sample, and movement distances that the probe moves every time and amplitudes of the probe after respective movements are recorded until the amplitude of the probe is the second amplitude, all the amplitudes of the probe after respective movements being more than or equal to the second amplitude.

In a feasible implementation, at first, the probe may be controlled to move the distance $Z_i$ from the preset reference position in the direction perpendicular to the top surface of the semiconductor reference sample, and an amplitude of the probe after movement is recorded. Then, the probe is controlled to move the distance $Z_i$ from the preset reference position in the direction perpendicular to the top surface of the semiconductor reference sample, and an amplitude of the probe after movement is recorded. Such operations are repeated until the amplitude of the probe is the second amplitude.

Herein, distance $Z_i$=first distance/n.

In the embodiment of the present disclosure, for ensuring the measurement accuracy, a magnitude of n may be preset. For example, n≤30 is set.

In another feasible implementation, at first, the probe may be controlled to move a random distance from the preset reference position in the direction perpendicular to the top surface of the semiconductor reference sample, and an amplitude of the probe after movement is recorded. Then, the probe is controlled to move a random distance from the preset reference position in the direction perpendicular to the top surface of the semiconductor reference sample, and an amplitude of the probe after movement is recorded. Such operations are repeated until the amplitude of the probe is the second amplitude.

In step d, the first distance is determined according to the recorded movement distances that the probe moves every time.

In a feasible implementation, the first distance $Z_1$ may be calculated based on:

$$Z_1 = \bar{Z} - 3\sigma.$$

$$\sigma = \sqrt{\frac{\sum_{i=1}^{n}(Z_i - \bar{Z})^2}{n-1}},$$

$\bar{Z}$ represents an average value of the movement distances that the probe moves every time, $Z_i$ represents the movement distance that the probe moves for the ith time, and n represents a movement count of the probe.

In a feasible implementation, the following operations are further included.

A second distance $Z_2$ is calculated based on:

$$Z_2 = \bar{Z} + 3\sigma.$$

If the movement distance $Z_i$ is less than the first distance $Z_1$ or greater than the second distance $Z_2$, preset prompting information is output for prompting a tester that the surface of the semiconductor structure to be measured is abnormal.

In S402, the probe is controlled to scan the top surface of the semiconductor reference sample while keeping the first distance in a direction parallel to the top surface of the semiconductor reference sample, and amplitudes of the probe at respective scanning points on the top surface of the semiconductor reference sample are detected.

In S403, a first amplitude threshold and a second amplitude threshold are determined according to the amplitudes of the probe at respective scanning points on the top surface of the semiconductor reference sample.

In a feasible implementation, the first amplitude threshold $A_1$ may be calculated based on:

$$A_1 = \bar{A} - 3\sigma.$$

The second amplitude threshold $A_2$ may be calculated based on:

$$A_2 = \bar{A} + 3\sigma.$$

$$\sigma = \sqrt{\frac{\sum_{j=1}^{m}(A_j - \bar{A})^2}{m-1}},$$

$\overline{A}$ represents an average value of the amplitudes of the probe at respective scanning points on the top surface of the semiconductor reference sample, $A_j$ represents the amplitude of the probe at a jth scanning point on the top surface of the semiconductor reference sample, and m represents the number of the scanning points of the probe on the top surface of the semiconductor reference sample.

Based on the contents described in the abovementioned embodiments, the operation, described in S103, that the CD of the semiconductor structure to be measured is determined according to the amplitudes of the probe at respective scanning points on the surface of the semiconductor structure to be measured specifically includes the following operations.

If the amplitude at a present scanning point on the surface of the semiconductor structure to be measured is greater than or equal to the first amplitude threshold and less than or equal to the second amplitude threshold, a first identifier is output at the present scanning point. For example, if the amplitude at the present scanning point on the surface of the semiconductor structure to be measured is greater than or equal to the first amplitude threshold and less than or equal to the second amplitude threshold, "1" is output at the present scanning point. If the amplitude at the present scanning point on the surface of the semiconductor structure to be measured is greater than the second amplitude threshold, a second identifier is output at the present scanning point. For example, if the amplitude at the present scanning point on the surface of the semiconductor structure to be measured is greater than the second amplitude threshold, "0" is output at the present scanning point.

It can be understood that, since the top surface of the semiconductor reference sample is relatively even, when the probe is controlled to scan the top surface of the semiconductor reference sample while keeping the first distance in the direction parallel to the top surface of the semiconductor reference sample, the acting force of the top surface of the semiconductor reference sample on the probe may substantially be kept in a relatively small range, namely the amplitudes of the probe at respective scanning points on the top surface of the semiconductor reference sample may be in a relatively small range. Therefore, when the amplitude at the present scanning point on the surface of the semiconductor structure to be measured is greater than the first amplitude threshold and less than the second amplitude threshold, it indicates that a distance between the present scanning point and the probe is in a normal range; and when the amplitude at the present scanning point on the surface of the semiconductor structure to be measured is greater than or equal to the second amplitude threshold, it indicates that the distance between the present scanning point and the probe clearly increases, and it can be inferred that the present scanning point is above a trench in the surface of the semiconductor structure to be measured.

In a feasible implementation, if the amplitude at the present scanning point on the surface of the semiconductor structure to be measured is less than the first amplitude threshold, the preset prompting information is output for prompting the tester that the surface of the semiconductor structure to be measured is abnormal.

It can be understood that, when the amplitude at the present scanning point on the surface of the semiconductor structure to be measured is less than or equal to the first amplitude threshold, it indicates that the distance between the present scanning point and the probe clearly decreases, and it can be inferred that the present scanning point may be abnormal, for example, there may be a particle, a process residue, a bump, etc., at the present scanning point. For avoiding the probe contacting with the surface of the semiconductor structure, the prompting information may be output to prompt the tester that the surface of the semiconductor structure to be measured is abnormal and bring conveniences to specialized analysis of the tester.

Figure 6:
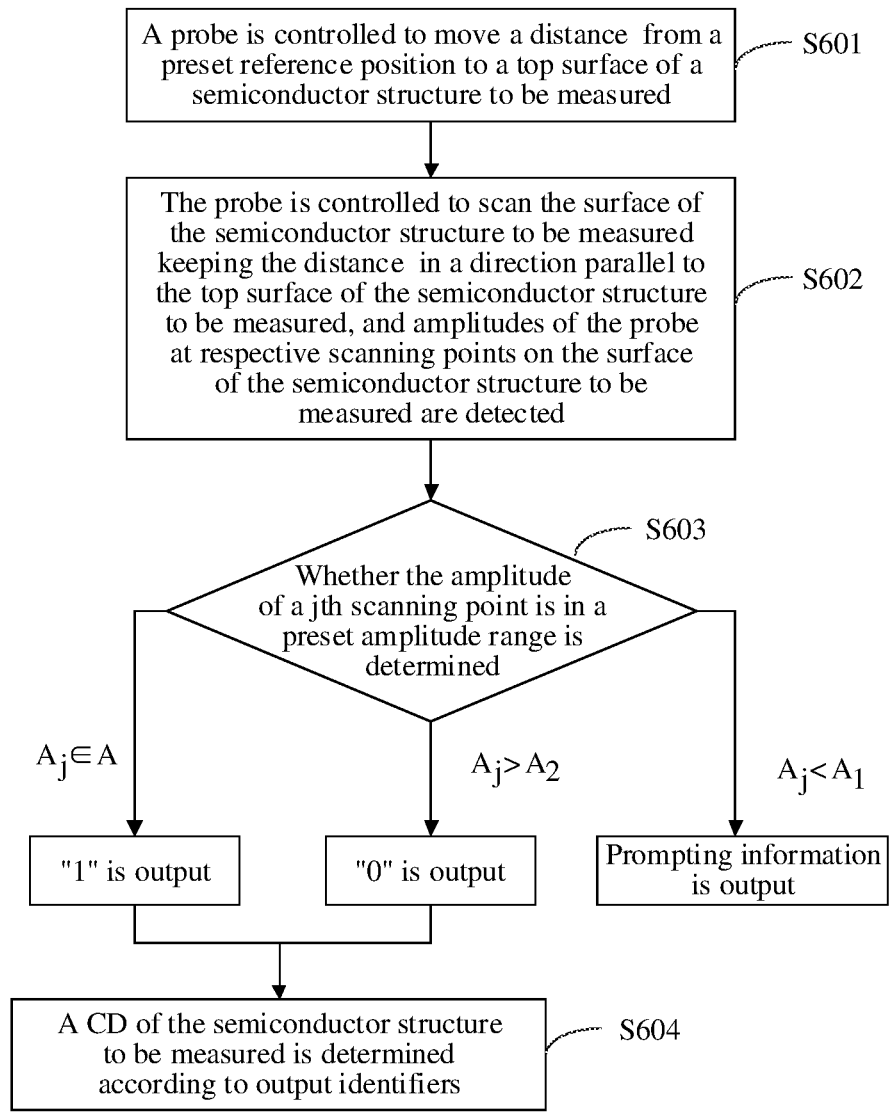
FIG. 6 is a third flowchart of a method for measuring dimension of a semiconductor structure according to an embodiment of the present disclosure.

Based on the contents described in the abovementioned embodiments, for understanding the embodiment of the present disclosure better, references are made to FIG. 6. FIG. 6 is a third flowchart of a method for measuring dimension of a semiconductor structure according to an embodiment of the present disclosure.

In FIG. 6, the method for measuring dimension of a semiconductor structure includes the following operations.

In S601, a probe is controlled to move a distance $Z_1$ from a preset reference position to a top surface of a semiconductor structure to be measured.

In S602, the probe is controlled to scan the surface of the semiconductor structure to be measured keeping the distance $Z_1$ in a direction parallel to the top surface of the semiconductor structure to be measured, and amplitudes of the probe at respective scanning points on the surface of the semiconductor structure to be measured are detected.

In S603, whether the amplitude $A_j$ of a jth scanning point is in a preset amplitude range is determined, the amplitude interval being $A=[A_1, A_2]$. If $A_j \in A$, "1" is output. If $A_j > A_2$, "0" is output. If $A_j < A_1$, prompting information is output.

In S604, a CD of the semiconductor structure to be measured is determined according to output identifiers.

In a feasible implementation, a first region where the first identifier "1" output when the surface of the semiconductor structure to be measured is scanned is distributed and a second region where the output second identifier "0" is distributed may be determined at first. Then, a boundary between the first region and the second region is determined, and the CD of the semiconductor structure to be measured is determined according to the boundary between the first region and the second region.

Figure 7:
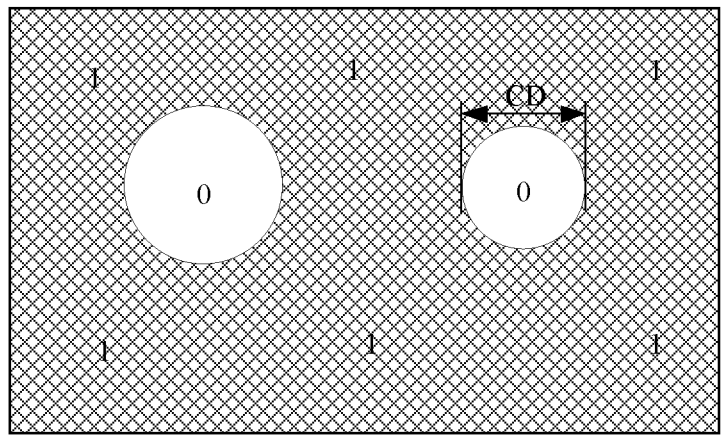
FIG. 7 is a schematic diagram of distribution regions of first identifiers and second identifiers output when a top surface of a semiconductor structure to be measured is scanned according to an embodiment of the present disclosure.

For understanding the embodiment of the present disclosure better, references are made to FIG. 7. FIG. 7 is a schematic diagram of distribution regions of first identifiers and second identifiers output when a top surface of a semiconductor structure to be measured is scanned according to an embodiment of the present disclosure.

In FIG. 7, if all the first identifiers "1" output when the surface of the semiconductor structure to be measured is scanned are distributed in the latticed region, and all the output second identifiers "0" are distributed in the white regions, a distance between boundaries of the latticed region and the white region may be measured to obtain the CD of the semiconductor structure to be measured.

Figure 8:
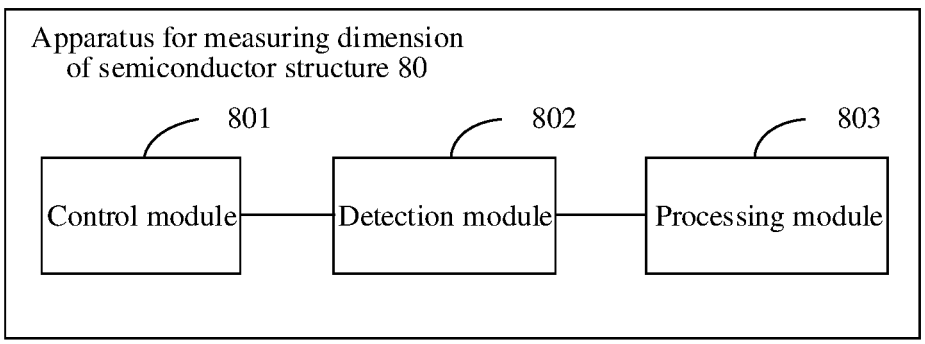
FIG. 8 is a schematic diagram of program modules of a CD measurement apparatus according to an embodiment of the present disclosure.

Based on the contents described in the abovementioned embodiments, an embodiment of the present disclosure also provides a CD measurement apparatus. Referring to FIG. 8 which is a schematic diagram of program modules of a CD measurement apparatus according to an embodiment of the present disclosure, the CD measurement apparatus 80 includes a control module 801, a detection module 802, and a processing module 803.

The control module 801 is configured to control a probe of an AFM to move a first distance from a preset reference position to a top surface of a semiconductor structure to be measured in a direction perpendicular to the top surface of the semiconductor structure to be measured.

The detection module 802 is configured to control the probe to scan the surface of the semiconductor structure to be measured while keeping the first distance in a direction parallel to the top surface of the semiconductor structure to be measured, and detect amplitudes of the probe at respective scanning points on the surface of the semiconductor structure to be measured.

The processing module 803 is configured to determine a CD of the semiconductor structure to be measured according to the amplitudes of the probe at respective scanning points on the surface of the semiconductor structure to be measured.

According to the semiconductor structure dimension measurement apparatus provided in the embodiment of the present disclosure, a spacing distance between the probe of the AFM and the top surface of the semiconductor structure to be measured is not affected by a surface structure of the semiconductor structure to be measured, so that, when there is a trench with a small width but a relatively great depth-to-width ratio, i.e., a trench with a high aspect ratio, in the surface of the semiconductor structure to be measured, the probe may not descend into the trench for scanning and contact with a sidewall of the trench in the measurement process, which avoids damages to the semiconductor structure to be measured. In addition, in the present disclosure, the amplitudes of the probe at respective scanning points on the surface of the semiconductor structure to be measured are detected to determine the CD of the semiconductor structure to be measured, and an interaction force between the semiconductor structure to be measured and the probe is not required to be detected, so that a measurement manner is simple, influences of the surface structure of the semiconductor structure to be measured are eliminated, and the present disclosure range is wider.

In a feasible implementation, the control module 801 is further configured to control the probe to move the first distance from the preset reference position to a top surface of a semiconductor reference sample in a direction perpendicular to the top surface of the semiconductor reference sample.

The detection module 802 is further configured to control the probe to scan the top surface of the semiconductor reference sample while keeping the first distance in a direction parallel to the top surface of the semiconductor reference sample, and detect amplitudes of the probe at respective scanning points on the top surface of the semiconductor reference sample.

The processing module 803 is further configured to determine a first amplitude threshold and a second amplitude threshold according to the amplitudes of the probe at respective scanning points on the top surface of the semiconductor reference sample.

In a feasible implementation, the processing module 803 is specifically configured to:

calculate the second amplitude threshold $A_1$ based on:

$A_1 = \overline{A} - 3\sigma$; and calculate the second amplitude threshold $A_2$ based on:

$A_2 = \overline{A} + 3\sigma$.

$$\sigma = \sqrt{\frac{\sum_{j=1}^{m}(A_j - \overline{A})^2}{m-1}},$$

$\overline{A}$ represents an average value of the amplitudes of the probe at respective scanning points on the top surface of the semiconductor reference sample, $A_j$ represents the amplitude of the probe at a jth scanning point on the top surface of the semiconductor reference sample, and m represents the number of the scanning points of the probe on the top surface of the semiconductor reference sample.

In a feasible implementation, the processing module 803 is specifically configured to:

if the amplitude at a present scanning point on the surface of the semiconductor structure to be measured is greater than or equal to the first amplitude threshold and less than or equal to the second amplitude threshold, output a first identifier at the present scanning point;

if the amplitude at the present scanning point on the surface of the semiconductor structure to be measured is greater than the second amplitude threshold, output a second identifier at the present scanning point; and determine the CD of the semiconductor structure to be measured according to identifiers output when the surface of the semiconductor structure to be measured is scanned.

In a feasible implementation, the processing module 803 is specifically configured to:

determine a first region where the first identifiers output when the surface of the semiconductor structure to be measured is scanned are distributed and a second region where the output second identifiers are distributed; and determine a boundary between the first region and the second region, and determine the CD of the semiconductor structure to be measured according to the boundary between the first region and the second region.

In a feasible implementation, the CD measurement apparatus 80 further includes a prompting module.

The prompting module is configured to, if the amplitude at the present scanning point on the surface of the semiconductor structure to be measured is less than the first amplitude threshold, output preset prompting information for prompting a tester that the surface of the semiconductor structure to be measured is abnormal.

In a feasible implementation, the control module 801 is further configured to:

determine a first amplitude when the probe is at the preset reference position and a driving frequency is a target driving frequency value and a second amplitude when the probe moves the first distance in the direction perpendicular to the top surface of the semiconductor reference sample and the driving frequency is the target driving frequency value according to relation between a curve of an amplitude and driving frequency of the probe in absence of an acting force and a curve of an amplitude and driving frequency of the probe in presence of an acting force;

adjust the probe to the preset reference position, and adjust the driving frequency of the probe to the target driving frequency value; and control the probe to move for multiple times from the preset reference position in the direction perpendicular to the top surface of the semiconductor reference sample, and record movement distances that the probe moves every time and amplitudes of the probe after respective movements until the amplitude of the probe is the second amplitude.

The processing module 803 is further configured to:

determine the first distance according to the recorded movement distances that the probe moves every time.

In a feasible implementation, the processing module 803 is specifically configured to:

calculate the first distance $Z_1$ based on:

$Z_1 = \overline{Z} - 3\sigma$.

$$\sigma = \sqrt{\frac{\sum_{i=1}^{n}(Z_i - \overline{Z})^2}{n-1}},$$

$\overline{Z}$ represents an average value of the movement distances that the probe moves every time, $Z_i$ represents the movement distance that the probe moves for the ith time, and n represents a movement count of the probe.

In a feasible implementation, the processing module 803 is further specifically configured to:

calculate a second distance $Z_2$ based on:

$Z_2 = \overline{Z} + 3\sigma$; and if the movement distance $Z_i$ is less than the first distance $Z_1$ or greater than the second distance $Z_2$, output the preset prompting information for prompting the tester that the surface of the semiconductor structure to be measured is abnormal.

It is to be noted that contents specifically executed by the control module 801, detection module 802, and processing module 803 in the embodiment of the present disclosure may refer to the related contents in the embodiments shown in FIG. 1 to FIG. 7, and will not be elaborated herein.

According to the method for measuring dimension of a semiconductor structure and device provided in the embodiments of the present disclosure, in a measurement process, the probe of the AFM is controlled at first to move the first distance from the preset reference position to the top surface of the semiconductor structure to be measured in the direction perpendicular to the top surface of the semiconductor structure to be measured, then the probe is controlled to scan the surface of the semiconductor structure to be measured while keeping the first distance in the direction parallel to the top surface of the semiconductor structure to be measured, the amplitudes of the probe at respective scanning points on the surface of the semiconductor structure to be measured are detected, and the CD of the semiconductor structure to be measured is determined according to the amplitudes of the probe at respective scanning points on the surface of the semiconductor structure to be measured. That is, in the present disclosure, a spacing distance between the probe of the AFM and the top surface of the semiconductor structure to be measured is not affected by a surface structure of the semiconductor structure to be measured, so that, when there is a trench with a small width but a relatively great depth-to-width ratio, i.e., a trench with a high aspect ratio, in the surface of the semiconductor structure to be measured, the probe may not descend into the trench for scanning and contact with a sidewall of the trench in the measurement process, which avoids damages to the semiconductor structure to be measured. In addition, in the present disclosure, the amplitudes of the probe at respective scanning points on the surface of the semiconductor structure to be measured are detected to determine the CD of the semiconductor structure to be measured, and an interaction force between the semiconductor structure to be measured and the probe is not required to be detected, so that a measurement manner is simple, influences of the surface structure of the semiconductor structure to be measured are eliminated, and the present disclosure range is wider.

Furthermore, based on the contents described in the abovementioned embodiments, an embodiment of the present disclosure also provides an AFM, which includes at least one processor and a memory. The memory stores a computer-executable instruction. The at least one processor executes the computer-executable instruction stored in the memory to implement each step in the method for measuring dimension of a semiconductor structure described in the abovementioned embodiment. Elaborations are omitted in the embodiment.

Figure 9:
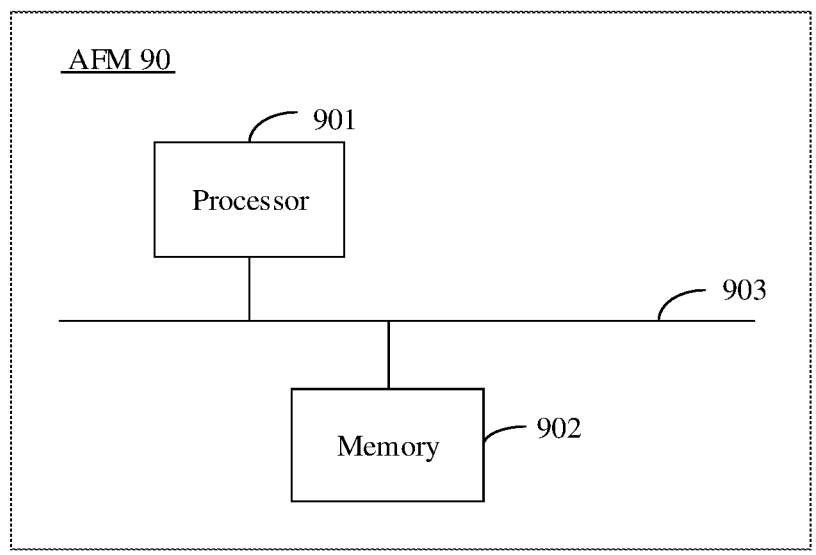
FIG. 9 is a hardware structure diagram of an AFM according to an embodiment of the present disclosure.

For understanding the embodiment of the present disclosure better, references are made to FIG. 9. FIG. 9 is a hardware structure diagram of an AFM according to an embodiment of the present disclosure.

As shown in FIG. 9, the AFM 90 of the embodiment includes a processor 901 and a memory 902.

The memory 902 is configured to store a computer-executable instruction.

The processor 901 is configured to execute the computer-executable instruction stored in the memory to implement each step of the method for measuring dimension of a semiconductor structure described in the abovementioned embodiments, specifically referring to the related descriptions in the method embodiments. Elaborations are omitted in the embodiment.

Optionally, the memory 902 may be independent, or may be integrated with the processor 901.

When the memory 902 is arranged independently, the device further includes a bus 903, configured to connect the memory 902 with the processor 901.

Furthermore, based on the contents described in the abovementioned embodiments, an embodiment of the present disclosure also provides a computer-readable storage medium, in which a computer-executable instruction is stored. The computer-executable instruction is executed by a processor to implement each step in the method for measuring dimension of a semiconductor structure described in the abovementioned embodiments, specifically referring to the related descriptions in the method embodiments. Elaborations are omitted in the embodiment.

Furthermore, based on the contents described in the abovementioned embodiments, an embodiment of the present disclosure also provides a computer program product, which includes a computer program. The computer program is executed by a processor to implement each step in the method for measuring dimension of a semiconductor structure described in the abovementioned embodiments, specifically referring to the related descriptions in the method embodiments. Elaborations are omitted in the embodiment.

In some embodiments provided by the present disclosure, it is to be understood that the disclosed device and method may be implemented in another manner. For example, the device embodiment described above is only schematic, and for example, division of the modules is only logic function division, and other division manners may be adopted during practical implementation. For example, multiple modules may be combined or integrated into another system, or some characteristics may be neglected or not executed. In addition, coupling or direct coupling or communication connection between each displayed or discussed component may be indirect coupling or communication connection, implemented through some interfaces, of the apparatus or the modules, and may be electrical and mechanical or adopt other forms.

The modules described as separate parts may or may not be physically separated, and parts displayed as modules may or may not be physical units, and namely may be located in the same place, or may also be distributed to multiple network units. Part or all of the modules may be selected to achieve the purposes of the solutions of the embodiments as practically required.

In addition, each function module in each embodiment of the present disclosure may be integrated into a processing module, or each module may also physically exist independently, or two or more than two modules may also be integrated into a module. The integrated module may be implemented in a hardware form, or may be implemented in form of hardware and software function unit.

The integrated module implemented in form of a software function module may be stored in a computer-readable storage medium. The software function module is stored in a storage medium, including a plurality of instructions configured to enable a computer device (which may be a personal computer, a server, a network device, etc.) or a processor to execute part of the steps of the method in each embodiment of the present disclosure.

It is to be understood that the processor may be a Central Processing Unit (CPU), or may be another general-purpose processor, a Digital Signal Processor (DSP), an Application Specific Integrated Circuit (ASIC), etc. The general-purpose processor may be a microprocessor, or the processor may also be any conventional processor, etc. The steps of the method disclosed in combination with the present disclosure may be directly embodied to be executed and completed by a hardware processor or executed and completed by a combination of hardware and software modules in the processor.

The memory may include a high-speed Random Access Memory (RAM), or may include a Non-Volatile Memory (NVM), for example, at least one disk memory, or may be a U disk, a mobile hard disk, a Read-Only Memory (ROM), a magnetic disk, an optical disk, etc.

The bus may be an Industry Standard Architecture (ISA) bus, a Peripheral Component Interconnect (PCI) bus, an Extended Industry Standard Component (EISA) bus, etc. The bus may be divided into an address bus, a data bus, a control bus, etc. For ease of representation, the bus in the drawings of the present disclosure is not limited to one bus or one type of bus.

The storage medium may be implemented by a volatile or non-volatile storage device of any type or a combination thereof, for example, a Static Random Access Memory (SRAM), an Electrically Erasable Programmable Read-Only Memory (EEPROM), an Erasable Programmable Read-Only Memory (EPROM), a Programmable Read-Only Memory (PROM), a ROM, a magnetic memory, a flash memory, a magnetic disk or an optical disk. The storage medium may be any available medium accessible for a universal or dedicated computer.

An exemplary storage medium is coupled to the processor, thereby enabling the processor to read information from the storage medium and write information into the storage medium. Of course, the storage medium may also be a component of the processor. The processor and the storage medium may be in an ASIC. Of course, the processor and the storage medium may also exist in an electronic device or a master control device as discrete components.

It can be understood by those of ordinary skill in the art that all or part of the steps of each method embodiment may be completed by instructing related hardware through a program. The program may be stored in a computer-readable storage medium. The program is executed to execute the steps of each method embodiment. The storage medium includes various media capable of storing program codes such as a ROM, a RAM, a magnetic disk or an optical disk.

It is finally to be noted that: the above embodiments are adopted not to limit but only to describe the technical solutions of the present disclosure. Although the present disclosure is described with reference to each embodiment in detail, those of ordinary skill in the art should know that modifications may also be made to the technical solutions recorded in each embodiment or equivalent replacements may be made to part or all of technical features therein. These modifications or replacements do not make the essence of the corresponding technical solutions depart from the scope of the technical solutions of each embodiment of the present disclosure.

The invention claimed is:

1. A method for measuring dimension of a semiconductor structure, comprising:
   controlling a probe of an Atomic Force Microscope (AFM) to move a first distance from a preset reference position to a top surface of a semiconductor structure to be measured in a direction perpendicular to the top surface of the semiconductor structure to be measured;
   controlling the probe to scan the top surface of the semiconductor structure to be measured while keeping the first distance in a direction parallel to the top surface of the semiconductor structure to be measured, and detecting amplitudes of the probe at respective scanning points on the top surface of the semiconductor structure to be measured; and
   determining a Critical Dimension (CD) of the semiconductor structure to be measured according to the amplitudes of the probe at respective scanning points on the top surface of the semiconductor structure to be measured;
   wherein the amplitudes of the probe are extents of oscillations of the probe.

2. The method of claim 1, wherein before controlling the probe of the AFM to move the first distance from the preset reference position to the top surface of the semiconductor structure to be measured in the direction perpendicular to the top surface of the semiconductor structure to be measured, the method further comprises:
   controlling the probe to move the first distance from the preset reference position to a top surface of a semiconductor reference sample in a direction perpendicular to the top surface of the semiconductor reference sample;
   controlling the probe to scan the top surface of the semiconductor reference sample while keeping the first distance in a direction parallel to the top surface of the semiconductor reference sample, and detecting amplitudes of the probe at respective scanning points on the top surface of the semiconductor reference sample; and
   determining a first amplitude threshold and a second amplitude threshold according to the amplitudes of the probe at respective scanning points on the top surface of the semiconductor reference sample.

3. The method of claim 2, wherein determining the first amplitude threshold and the second amplitude threshold according to the amplitudes of the probe at respective scanning points on the top surface of the semiconductor reference sample comprises:
   calculating the first amplitude threshold $A_1$ based on:

$$A_1 = \overline{A} - 3\sigma; \text{ and}$$

calculating the second amplitude threshold $A_2$ based on:

$$A_2 = \overline{A} + 3\sigma,$$

where $$\sigma = \sqrt{\frac{\sum_{j=1}^{m}(A_j - \overline{A})^2}{m-1}},$$

where $\overline{A}$ represents an average value of the amplitudes of the probe at respective scanning points on the top surface of the semiconductor reference sample, $A_j$ represents the amplitude of the probe at a jth scanning point on the top surface of the semiconductor reference sample, and m represents a number of the scanning points of the probe on the top surface of the semiconductor reference sample.

4. The method of claim 3, wherein determining the CD of the semiconductor structure to be measured according to the amplitudes of the probe at respective scanning points on the top surface of the semiconductor structure to be measured comprises:

when the amplitude at a present scanning point on the top surface of the semiconductor structure to be measured is greater than or equal to the first amplitude threshold and less than or equal to the second amplitude threshold, outputting a first identifier at the present scanning point;

when the amplitude at the present scanning point on the top surface of the semiconductor structure to be measured is greater than the second amplitude threshold, outputting a second identifier at the present scanning point; and determining the CD of the semiconductor structure to be measured according to identifiers output when the top surface of the semiconductor structure to be measured is scanned.

5. The method of claim 4, wherein determining the CD of the semiconductor structure to be measured according to the identifiers output when the top surface of the semiconductor structure to be measured is scanned comprises:

determining a first region where the first identifiers output when the top surface of the semiconductor structure to be measured is scanned are distributed and a second region where the second identifiers output when the top surface of the semiconductor structure to be measured is scanned are distributed; and determining a boundary between the first region and the second region, and determining the CD of the semiconductor structure to be measured according to the boundary between the first region and the second region.

6. The method of claim 4, further comprising:

when the amplitude at the present scanning point on the top surface of the semiconductor structure to be measured is less than the first amplitude threshold, outputting preset prompting information for prompting a tester that the top surface of the semiconductor structure to be measured is abnormal.

7. The method of claim 2, wherein before controlling the probe to move the first distance from the preset reference position to the top surface of the semiconductor reference sample in the direction perpendicular to the top surface of the semiconductor reference sample, the method further comprises:

determining a first amplitude when the probe is at the preset reference position and a driving frequency is a target driving frequency value and a second amplitude when the probe moves the first distance in the direction perpendicular to the top surface of the semiconductor reference sample and the driving frequency is the target driving frequency value according to a relation between a curve of an amplitude and driving frequency of the probe in absence of an acting force and a curve of an amplitude and driving frequency of the probe in presence of the acting force;

adjusting the probe to the preset reference position, and adjusting the driving frequency of the probe to the target driving frequency value;

controlling the probe to move for multiple times from the preset reference position in the direction perpendicular to the top surface of the semiconductor reference sample, and recording movement distances that the probe moves every time and amplitudes of the probe after respective movements until the amplitude of the probe is the second amplitude; and determining the first distance according to the recorded movement distances that the probe moves every time.

8. The method of claim 7, wherein determining the first distance according to the recorded movement distances that the probe moves every time comprises:

calculating the first distance $Z_1$ based on:

$$Z_1 = \overline{Z} - 3\sigma,$$

where $$\sigma = \sqrt{\frac{\sum_{i=1}^{n}(Z_i - \overline{Z})^2}{n-1}},$$

$\overline{Z}$ represents an average value of the movement distances that the probe moves every time, $Z_i$ represents the movement distance that the probe moves for the ith time, and n represents a movement count of the probe.

9. The method of claim 8, further comprising:

calculating a second distance $Z_2$ based on:

$$Z_2 = \overline{Z} + 3\sigma; \text{ and}$$

when the movement distance $Z_i$ is less than the first distance $Z_1$ or greater than the second distance $Z_2$, outputting preset prompting information for prompting a tester that the top surface of the semiconductor structure to be measured is abnormal.

10. An apparatus for measuring dimension of a semiconductor structure, comprising:

a memory for storing computer-executable instructions; and at least one processor configured to execute the computer-executable instructions to perform operations of:

controlling a probe of an Atomic Force Microscope (AFM) to move a first distance from a preset reference position to a top surface of a semiconductor structure to be measured in a direction perpendicular to the top surface of the semiconductor structure to be measured;

controlling the probe to scan the top surface of the semiconductor structure to be measured while keeping the first distance in a direction parallel to the top surface of the semiconductor structure to be measured, and detecting amplitudes of the probe at respective scanning points on the top surface of the semiconductor structure to be measured; and determining a Critical Dimension (CD) of the semiconductor structure to be measured according to the amplitudes of the probe at respective scanning points on the top surface of the semiconductor structure to be measured;

wherein the amplitudes of the probe are extents of oscillations of the probe.

11. The apparatus of claim 10, wherein
the at least one processor is configured to execute the computer-executable instructions to:
control the probe to move the first distance from the preset reference position to a top surface of a semiconductor reference sample in a direction perpendicular to the top surface of the semiconductor reference sample;
control the probe to scan the top surface of the semiconductor reference sample while keeping the first distance in a direction parallel to the top surface of the semiconductor reference sample, and detect amplitudes of the probe at respective scanning points on the top surface of the semiconductor reference sample; and
determine a first amplitude threshold and a second amplitude threshold according to the amplitudes of the probe at respective scanning points on the top surface of the semiconductor reference sample.

12. The apparatus of claim 11, wherein the at least one processor is further configured to execute the computer-executable instructions to:
calculating the first amplitude threshold $A_1$ based on:

$$A_1 = \overline{A} - 3\sigma;\text{ and}$$

calculating the second amplitude threshold $A_2$ based on:

$$A_2 = \overline{A} + 3\sigma,$$

where $$\sigma = \sqrt{\frac{\sum_{j=1}^{m}(A_j - \overline{A})^2}{m-1}},$$

where $\overline{A}$ represents an average value of the amplitudes of the probe at respective scanning points on the top surface of the semiconductor reference sample, $A_j$ represents the amplitude of the probe at a jth scanning point on the top surface of the semiconductor reference sample, and m represents a number of the scanning points of the probe on the top surface of the semiconductor reference sample.

13. The apparatus of claim 12, wherein the at least one processor is further configured to execute the computer-executable instructions to:
when the amplitude at a present scanning point on the top surface of the semiconductor structure to be measured is greater than or equal to the first amplitude threshold and less than or equal to the second amplitude threshold, output a first identifier at the present scanning point;
when the amplitude at the present scanning point on the top surface of the semiconductor structure to be measured is greater than the second amplitude threshold, output a second identifier at the present scanning point; and
determine the CD of the semiconductor structure to be measured according to identifiers output when the top surface of the semiconductor structure to be measured is scanned.

14. The apparatus of claim 13, wherein the at least one processor is further configured to execute the computer-executable instructions to:
determine a first region where the first identifiers output when the top surface of the semiconductor structure to be measured is scanned are distributed and a second region where the second identifiers output when the top surface of the semiconductor structure to be measured is scanned are distributed; and
determine a boundary between the first region and the second region, and determine the CD of the semiconductor structure to be measured according to the boundary between the first region and the second region.

15. The apparatus of claim 13, wherein the at least one processor is further configured to execute the computer-executable instructions to:
when the amplitude at the present scanning point on the top surface of the semiconductor structure to be measured is less than the first amplitude threshold, output preset prompting information for prompting a tester that the top surface of the semiconductor structure to be measured is abnormal.

16. The apparatus of claim 11, wherein the at least one processor is further configured to execute the computer-executable instructions to:
determine a first amplitude when the probe is at the preset reference position and a driving frequency is a target driving frequency value, and a second amplitude when the probe moves the first distance in the direction perpendicular to the top surface of the semiconductor reference sample and the driving frequency is the target driving frequency value according to a relation between a curve of an amplitude and driving frequency of the probe in absence of an acting force and a curve of an amplitude and driving frequency of the probe in presence of the acting force;
adjust the probe to the preset reference position, and adjust the driving frequency of the probe to the target driving frequency value;
control the probe to move for multiple times from the preset reference position in the direction perpendicular to the top surface of the semiconductor reference sample, and record movement distances that the probe moves every time and amplitudes of the probe after respective movements until the amplitude of the probe is the second amplitude; and
determine the first distance according to the recorded movement distances that the probe moves every time.

17. The apparatus of claim 16, wherein the at least one processor is further configured to execute the computer-executable instructions to:
calculate the first distance $Z_1$ based on:

$$Z_1 = \overline{Z} - 3\sigma,$$

where $$\sigma = \sqrt{\frac{\sum_{i=1}^{n}(Z_i - \overline{Z})^2}{n-1}},$$

$\overline{Z}$ represents an average value of the movement distances that the probe moves every time, $Z_i$ represents the movement distance that the probe moves for the ith time, and n represents a movement count of the probe.

18. The apparatus of claim 17, wherein the at least one processor is further configured to execute the computer-executable instructions to:

calculate a second distance $Z_2$ based on:

$$Z_2 = \overline{Z} + 3\sigma;\text{ and}$$

when the movement distance $Z_i$ is less than the first distance $Z_1$ or greater than the second distance $Z_2$, output preset prompting information for prompting a tester that the top surface of the semiconductor structure to be measured is abnormal.

19. An Atomic Force Microscope (AFM), comprising at least one processor and a memory, wherein the memory stores a computer-executable instruction; and when the at least one processor executes the computer-executable instruction stored in the memory, the at least one processor executes the method for measuring dimension of a semiconductor structure of claim 1.

20. A non-transitory computer-readable storage medium having stored computer-executable instructions that when executed, implement a method for measuring dimension of a semiconductor structure, the method comprising:

controlling a probe of an Atomic Force Microscope (AFM) to move a first distance from a preset reference position to a top surface of a semiconductor structure to be measured in a direction perpendicular to the top surface of the semiconductor structure to be measured;

controlling the probe to scan the top surface of the semiconductor structure to be measured while keeping the first distance in a direction parallel to the top surface of the semiconductor structure to be measured, and detecting amplitudes of the probe at respective scanning points on the top surface of the semiconductor structure to be measured; and determining a Critical Dimension (CD) of the semiconductor structure to be measured according to the amplitudes of the probe at respective scanning points on the top surface of the semiconductor structure to be measured;

wherein the amplitudes of the probe are extents of oscillations of the probe.

* * * * *